(12) United States Patent
Chiu

(10) Patent No.: US 11,677,034 B2
(45) Date of Patent: Jun. 13, 2023

(54) FPCB/FCCL REPLACING TINNED-COPPER WELDING STRIP AS PHOTOVOLTAIC MODULE BUS BAR

(71) Applicant: Golden Solar (Quanzhou) New Energy Technology Co., Ltd., Quanzhou (CN)

(72) Inventor: Hsin-Wang Chiu, Quanzhou (CN)

(73) Assignee: GOLDEN SOLAR (QUANZHOU) NEW ENERGY TECHNOLOGY CO., LTD., Quanzhou (CH)

( * ) Notice: Subject to any disclaimer, the term of this patent is extended or adjusted under 35 U.S.C. 154(b) by 0 days.

(21) Appl. No.: 17/456,578

(22) Filed: Nov. 25, 2021

(65) Prior Publication Data
US 2022/0320352 A1      Oct. 6, 2022

(30) Foreign Application Priority Data
Mar. 30, 2021   (CN) .................... 202110337958.X

(51) Int. Cl.
*H01L 31/02*   (2006.01)
*H05K 1/02*   (2006.01)
*H05K 1/03*   (2006.01)

(52) U.S. Cl.
CPC ......... *H01L 31/0201* (2013.01); *H05K 1/028* (2013.01); *H05K 1/032* (2013.01); *H05K 2201/0355* (2013.01)

(58) Field of Classification Search
CPC .... H01L 31/0201; H05K 1/028; H05K 1/032; H05K 2201/0355
See application file for complete search history.

(56) References Cited

U.S. PATENT DOCUMENTS

| 2012/0216849 A1 | 8/2012 | Cho et al. |
| 2015/0263182 A1* | 9/2015 | Vornbrock ............. H01L 31/18 136/244 |
| 2017/0163212 A1 | 6/2017 | France et al. |

FOREIGN PATENT DOCUMENTS

| CN | 101488536 A | 7/2009 |
| CN | 103681894 A | 3/2014 |
| CN | 106604538 A | 4/2017 |
| CN | 111347745 A | 6/2020 |
| KR | 101144935 B1 | 5/2012 |
| KR | 20130093876 A | 8/2013 |
| WO | 2009033215 A1 | 3/2009 |

* cited by examiner

*Primary Examiner* — Timothy J Thompson
*Assistant Examiner* — John B Freal
(74) *Attorney, Agent, or Firm* — Bayramoglu Law Offices LLC

(57) ABSTRACT

A FPCB/FCCL replacing a tinned-copper welding strip as a photovoltaic module bus bar is a composite material including an insulating base material and a conductive layer, and the insulating base material is made from PI or PET, and the conductive layer is generally the copper foil. According to the present invention, when the flexible solar module adopts the FPCB/FCCL to replace the tinned-copper welding strip as the photovoltaic module bus bar, the product quality and product stability are greatly improved, and the FPCB/FCCL bus bar is also suitable for the double-glass solar module and the single-glass solar module. The copper foil of FPCB/FCCL may be integrated with circuits, or be the complete copper foil (without circuits), or the copper foil of FPCB/FCCL may simultaneously has the part with circuits and the part without circuits.

4 Claims, 2 Drawing Sheets

FPCB/FCCL REPLACING TINNED-COPPER WELDING STRIP AS PHOTOVOLTAIC MODULE BUS BAR

CROSS REFERENCE TO THE RELATED APPLICATIONS

This application is based upon and claims priority to Chinese Patent Application No. 202110337958.X, filed on Mar. 30, 2021, the entire contents of which are incorporated herein by reference.

TECHNICAL FIELD

The present invention relates to the technical field of the photovoltaic module, and more particularly, to a flexible print circuit board (FPCB)/flexible copper clad laminate (FCCL) replacing a tinned-copper welding strip as a photovoltaic module bus bar.

BACKGROUND

The traditional solar cell piece bus bar adopts the tinned-copper welding strip. Although the tinned-copper welding strip is soft and rollable, when used in the flexible solar module, since the flexible solar module has a rollable feature, the tinned-copper welding strip is liable to become fatigued and fragile after the repeated rolling, bending, or other alternating loads, resulting in fracture, resulting in open circuit. In this way, the current emitted by the photovoltaic module cannot be conducted, which greatly reduces the performance of the flexible module. In this context, the present invention provides a FPCB/FCCL replacing the tinned-copper welding strip as a photovoltaic module bus bar.

SUMMARY

In view of the above problems, the present invention provides a FPCB/FCCL replacing a tinned-copper welding strip as a photovoltaic module bus bar.

In order to solve the above technical problems, the technical solution adopted by the present invention is as follows. A FPCB/FCCL replacing the tinned-copper welding strip as the photovoltaic module bus bar is provided, and the FPCB/FCCL is a composite material including an insulating base material and a conductive layer. The insulating base material is made from polyimide (PI) or polyethylene terephthalate (PET), and the conductive layer is generally the copper foil.

Further, the FPCB/FCCL as a base material may be made into a conductive circuit of arbitrary shape, such as sheet, strip, and others.

Further, the FPCB/FCCL as a base material may be made in the form of FPCB.

Further, the FPCB/FCCL includes and is not limited to a composite copper foil with the PI or PET as an organic material, or other metal foil.

Further, a conductive copper foil or other metal on the FPCB/FCCL may be combined by adhesive bonding, pressing, electroplating, plasma enhanced chemical vapor deposition (PECVD) process, or chemical vapor deposition (CVD) process.

Further, the FPCB/FCCL may also be made into various customized circuits with different sizes and shapes according to the requirements of the related voltage and current parameters of solar cell modules. The width of the FPCB/FCCL bus bar, the thickness of the copper foil layer, whether the copper foil layer is electroplated with the metal, the thickness of the electroplated metal, and others may be designed according to the voltage and current requirements of the solar cell modules.

From the above description of the structure of the present invention, compared with the prior art, the present invention has the following advantages.

According to the present invention, when the flexible solar module adopts the FPCB/FCCL to replace the tinned-copper welding strip as the photovoltaic module bus bar, the product quality and product stability are greatly improved, and the FPCB/FCCL bus bar is also suitable for the double-glass solar module and the single-glass solar module. The copper foil of FPCB/FCCL may be integrated with circuits, or be the complete copper foil (without circuits), or the copper foil of FPCB/FCCL may simultaneously has the part with circuits and the part without circuits. The shapes and the sizes of the copper foil of the FPCB/FCCL may be customized according to the usage occasion, and the sizes of the copper foil of the FPCB/FCCL may also be adjusted according to the battery parameters.

BRIEF DESCRIPTION OF THE DRAWINGS

The drawings, as a part of the present application, are used to provide further understanding of the present invention, and the schematic embodiments of the present invention and the description thereof are used to explain the present invention and do not constitute an undue limitation of the present invention. In the drawings.

DETAILED DESCRIPTION OF THE EMBODIMENTS

In order to make the objective, the technical solution, and the advantages of the present invention clearer, the present invention is further explained in detail below in combination with the drawings and the embodiments. It should be understood that the specific embodiments described herein are only used to explain the present invention and are not used to limit the present invention.

Embodiment

Figure 1:
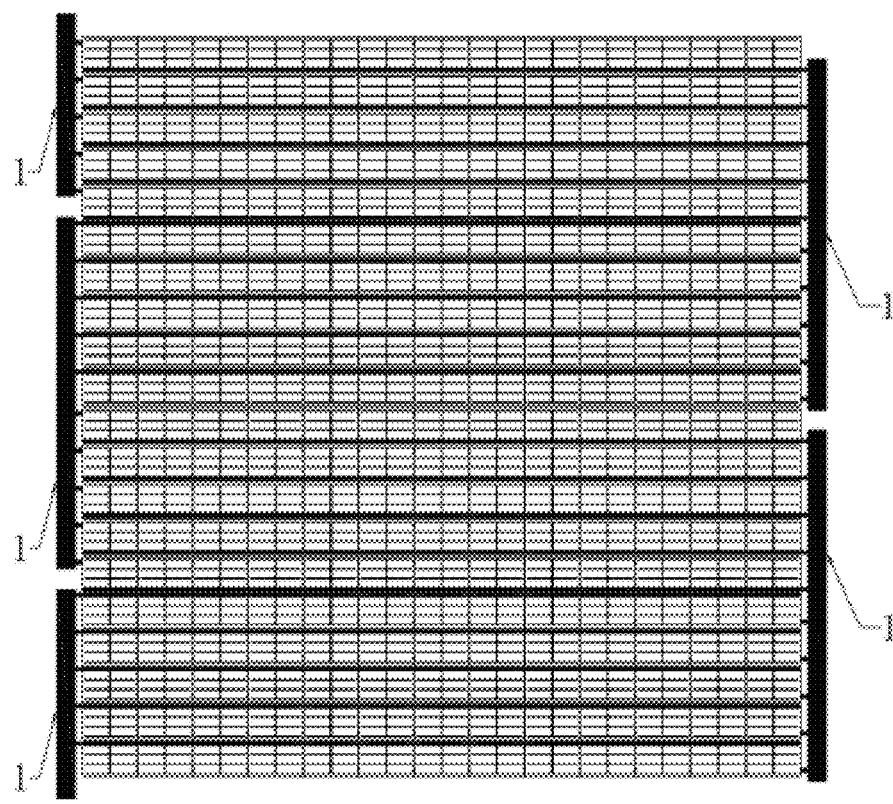
FIG. 1 is a welding usage diagram of the FPCB/FCCL copper foil bus bar of the present invention.
Figure 2:
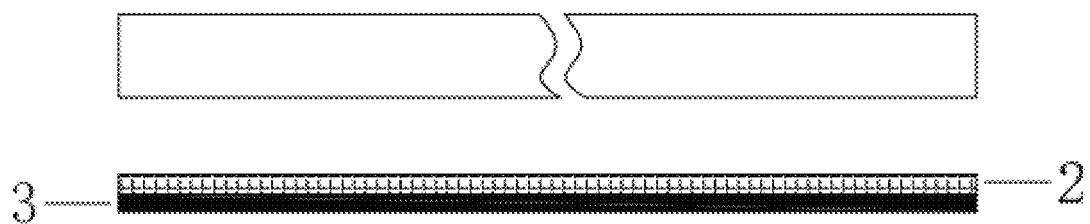
FIG. 2 is a diagram of the FPCB/FCCL copper foil bus bar without circuits of the present invention.
Figure 3:
FIG. 3 is a diagram of the FPCB/FCCL having circuits of the present invention.
Figure 4:
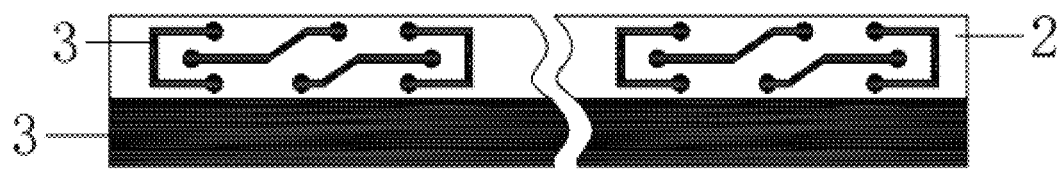
FIG. 4 is a diagram of the FPCB/FCCL simultaneously having the part with circuits and the part without circuits of the present invention.

Referring to FIGS. 1-4, the FPCB/FCCL 1 replacing the tinned-copper welding strip as the photovoltaic module bus bar is provided. The FPCB/FCCL 1 is a composite material including the insulating base material 2 and the conductive layer 3. The insulating base material 2 is made from PI or PET, and the conductive layer 3 is generally the copper foil. PI (or PET) is a flexible material with elasticity and may be randomly bent and flexed, so PI (or PET) is more suitable for the flexible solar module that requires repeated flexure. After one million times or more of upwind vibration tests, there is no obvious decrease in various indexes of PI (or PET). Compared with the tinned-copper welding strip, the FPCB/FCCL 1 may also reduce the stress damage between the welding spots by means of elasticity. Therefore, the FPCB/FCCL 1, as the photovoltaic module bus bar, is also suitable for the non-flexible double-glass solar module and the non-flexible single-glass solar module, so as to improve product quality and increase product stability. Moreover, the shape and the size of the circuits of the FPCB/FCCL 1 may be customized according to the usage occasion and the battery parameters, to satisfy more application scenarios.

The FPCB/FCCL 1 as a base material may be made into the conductive circuit of arbitrary shape, such as sheet, strip, and others.

The FPCB/FCCL 1 as a base material may be made in the form of FPCB.

The FPCB/FCCL 1 includes and is not limited to a composite copper foil with the PI or PET as an organic material, or other metal foil.

The conductive copper foil or other metal on the FPCB/FCCL 1 may be combined by adhesive bonding, pressing, electroplating, PECVD process, or CVD process.

The FPCB/FCCL 1 may also be made into various customized circuits with different sizes and shapes according to the requirements of the related voltage and current parameters of solar cell modules. The width of the FPCB/FCCL bus bar, the thickness of the copper foil layer, whether the copper foil layer is electroplated with the metal, the thickness of the electroplated metal, and others may be designed according to the voltage and current requirements of the solar cell modules.

According to the present invention, when the flexible solar module adopts the FPCB/FCCL to replace the tinned-copper welding strip as the photovoltaic module bus bar, the product quality and product stability are greatly improved, and the FPCB/FCCL bus bar is also suitable for the double-glass solar module and the single-glass solar module. The copper foil of FPCB/FCCL may be integrated with circuits, or be the complete copper foil (without circuits), or the copper foil of FPCB/FCCL may simultaneously has the part with circuits and the part without circuits. The shapes and the sizes of the copper foil of the FPCB/FCCL may be customized according to the usage occasion, and the sizes of the copper foil of the FPCB/FCCL may also be adjusted according to the battery parameters.

The above only describes preferred embodiments of the present invention and are not used to limit the present invention. Any modifications, equivalent replacements, and improvements made within the spirit and principles of the present invention shall fall within the scope of protection of the present invention.

What is claimed is:

1. A flexible print circuit board (FPCB)/flexible copper clad laminate (FCCL) replacing a tinned-copper welding strip as a photovoltaic module bus bar, wherein the FPCB/FCCL is a composite material comprising an insulating base material and a conductive layer, and the insulating base material is made from polyimide (PI) or polyethylene terephthalate (PET), wherein
    the FPCB/FCCL comprises a composite of copper foil with the PI or the PET as an organic material,
    a first part of the copper foil of FPCB/FCCL comprises a circuit and a second part of the copper foil does not comprise a circuit, and
    the FPCB/FCCL is configured for use in a flexible solar module requiring repeated flexure by resisting becoming fatigued and fragile and avoiding fracture and opening of the circuit.

2. The FPCB/FCCL replacing the tinned-copper welding strip as the photovoltaic module bus bar according to claim 1, wherein the FPCB/FCCL is in a shape of a sheet.

3. The FPCB/FCCL replacing the tinned-copper welding strip as the photovoltaic module bus bar according to claim 1, wherein the FPCB/FCCL as a base material is made in a form of the FPCB.

4. The FPCB/FCCL replacing the tinned-copper welding strip as the photovoltaic module bus bar according to claim 1, wherein the copper foil on the FPCB/FCCL is combined by an adhesive bonding, a pressing, an electroplating, a plasma enhanced chemical vapor deposition (PECVD) process, or a chemical vapor deposition (CVD) process.

\* \* \* \* \*